(12) United States Patent
Tahara et al.

(10) Patent No.: US 6,777,997 B2
(45) Date of Patent: Aug. 17, 2004

(54) SEMICONDUCTOR INTEGRATED CIRCUIT AND A BURN-IN METHOD THEREOF

(75) Inventors: Shigemitsu Tahara, Chitose (JP);
Daisuke Katagiri, Chitose (JP);
Takeshi Shimanuki, Yonezawa (JP);
Masashi Oshiba, Tachikawa (JP)

(73) Assignees: Renesas Technology Corp., Tokyo (JP); Northern Japan Semiconductor Technologies, Inc., Hokkaido (JP)

( * ) Notice: Subject to any disclaimer, the term of this patent is extended or adjusted under 35 U.S.C. 154(b) by 0 days.

(21) Appl. No.: 10/309,183

(22) Filed: Dec. 4, 2002

(65) Prior Publication Data

US 2003/0137340 A1 Jul. 24, 2003

(30) Foreign Application Priority Data

Jan. 18, 2002 (JP) ........................................ 2002-009500

(51) Int. Cl.[7] .............................................. H03L 5/00
(52) U.S. Cl. ......................... 327/333; 327/111; 327/81
(58) Field of Search ................................ 327/112, 319, 327/333, 437; 326/81

(56) References Cited

U.S. PATENT DOCUMENTS

| | | | |
|---|---|---|---|
| 6,353,345 B1 * | 3/2002 | Yushan et al. .............. | 327/112 |
| 6,445,226 B2 * | 9/2002 | Taniguchi .................... | 327/112 |
| 6,586,974 B1 * | 7/2003 | Humphrey et al. ......... | 327/108 |
| 2003/0094971 A1 * | 5/2003 | Harada ........................ | 326/81 |
| 2003/0132779 A1 * | 7/2003 | Yoo et al. .................... | 326/81 |
| 2003/0164723 A1 * | 9/2003 | Suzuki ........................ | 327/112 |

FOREIGN PATENT DOCUMENTS

| | | |
|---|---|---|
| JP | 9-008632 | 1/1997 |
| JP | 2000-353947 | 12/2000 |

* cited by examiner

*Primary Examiner*—Terry D. Cunningham
(74) *Attorney, Agent, or Firm*—Miles & Stockbridge P.C.

(57) ABSTRACT

The present invention realizes higher-speed external output operation synchronized with a clock signal from the viewpoint of prevention of output operation delay due to a level shift circuit and maintenance of a high breakdown voltage of an output buffer. A semiconductor integrated circuit includes a first circuit and a second circuit having a breakdown voltage higher than a breakdown voltage of the first circuit, and operation voltages of the first and second circuits can be made equal to each other or different from each other. The second circuit has a plurality of level shift circuits capable of shifting the level of an output of the first circuit in accordance with an operation voltage of the second circuit, a plurality of external output buffers receiving outputs of the level shift circuits, bypasses for bypassing an input of a predetermined level shift circuit to an input of a predetermined external output buffer, and a selecting circuit for selecting connection of either the predetermined level shift circuit or a bypass to an input of the predetermined external output buffer. In a use form in which the first and second circuits operate with a low voltage, the bypass is selected. In high-voltage operation and burn-in, the level shift circuits are selected.

11 Claims, 15 Drawing Sheets

FIG. 7

| OPERATION STATUS | SIGNAL 87 | INVERTER OUTPUT 83 | INVERTER OUTPUT 84 | CLOCKED INVERTER 76, 77 | CLOCKED INVERTER 75, 78 | REMARKS |
|---|---|---|---|---|---|---|
| NORMAL OPERATION LPC COMMUNICATION EFFECTIVE VCC=VCL=3.3V | 3.3V (VCL) | 3.3V (VCL) | 0.0V | ON | OFF | ALTHOUGH THIS MODE CAN USE ONLY THE TIME OF VCC=VCL, HIGH-SPEED OPERATION IS POSSIBLE. |
| NORMAL OPERATION LPC COMMUNICATION INVALID VCC=5.0V, VCL=3.2V | 0.0V | 0.0V | 5.0V (VCC) | OFF | ON | ALTHOUGH HIGH-SPEED OPERATION CAN NOT BE CARRIED OUT, SUPPLY OF THE VOLTAGE OF VCC>VCL IS POSSIBLE. |
| BURN-IN (LPC COMMUNICATION INVALID) VCC=7.0V, VCL=4.6V | 0.0V | 0.0V | 7.0V (VCC) | OFF | ON | IT IS POSSIBLE TO SUPPLY THE HIGH STRESS VOLTAGE TO THE MOSFETS WHICH SUSTAIN HIGH-VOLTAGE. |

FIG. 14

| OPERATION STATUS | SIGNAL 120 | SIGNAL 121 | SIGNAL 122 | CLOCKED INVERTER 76, 77 | CLOCKED INVERTER 75, 78 | CLOCKED INVERTER 114, 115 | REMARKS |
|---|---|---|---|---|---|---|---|
| NORMAL OPERATION VCC=VCL=1.8V | VCL | 0.0V | 0.0V | ON | OFF | OFF | 70,71 OUTPUT |
| NORMAL OPERATION VCC=3.3V, VCL=1.8V | 0.0V | VCL | 0.0V | OFF | ON | OFF | 54,55 OUTPUT |
| NORMAL OPERATION VCC=5.0V, VCL=1.8V | 0.0V | 0.0V | VCL | OFF | OFF | ON | 110,111 OUTPUT |
| BURN-IN VCC=7.0V, VCL=2.8V | 0.0V | 0.0V | VCL | OFF | OFF | ON | 110,111 OUTPUT |

SEMICONDUCTOR INTEGRATED CIRCUIT AND A BURN-IN METHOD THEREOF

BACKGROUND OF THE INVENTION

The present invention relates to a semiconductor integrated circuit technique for addressing increase in speed of external output operation synchronized with a clock signal. More particularly, the invention relates to, for example, a semiconductor integrated circuit using, in an external interface portion, a MOS transistor having a breakdown voltage higher than that of an internal circuit and, further, to a technique effective to be applied to a burn-in method of such a semiconductor integrated circuit.

Japanese Unexamined Patent Application No. 9(1996)-8632 discloses a technique of stepping down an external power supply voltage within an LSI and making an external interface circuit operate with an external power supply voltage by using the stepped-down voltage as an operation power source of an internal circuit from a viewpoint of reduction in the size of a circuit device, reduction in power consumption, and the like. Japanese Unexamined Patent Application No. 2000-353947 discloses a technique in a semiconductor output circuit having a function of shifting the level of an internal signal to a signal level of a breakdown voltage of a semiconductor device or higher and outputting the resultant, and a function of outputting a signal at the internal signal level which is before the level shifting. In the semiconductor output circuit, for an output buffer in which a MOS transistor for protection used to increase a breakdown voltage between the gate and source of an output buffer transistor is provided on the power supply side, in order to prevent delay in speed of change in rising of a signal caused by on-state resistance of the MOS transistor for protection (the power supply voltage of the output buffer is the same as that in the internal circuit), the on-state resistance of the MOS transistor for protection is set to be varied by controlling a gate voltage.

SUMMARY OF THE INVENTION

In the conventional techniques, however, attention is not paid to delay in the output operation due to the level shifting function and, further, delay in external output operation due to propagation delay in a clock signal with respect to the point of addressing increase in the speed of external output operation synchronized with a clock signal. The inventor herein has examined the following points with respect to the point of addressing increase in speed of the external output operation synchronized with a clock signal.

First, the output operation delay due to the level shifting function was examined. For example, a semiconductor integrated circuit after a 0.35 μm process internally uses an MOS transistor having a low breakdown voltage and uses a MOS transistor of a high breakdown voltage in an interface portion with the outside. To operate an internal circuit with a low voltage such as 3.3V and operate the interface portion with a high voltage like 5.0V, a level shift circuit for shifting a low-voltage amplitude to a high-voltage amplitude is inserted between the internal circuit and an input/output buffer. If a low-voltage power is supplied to both of the internal circuit and the interface portion, the whole semiconductor integrated circuit can operate with a low voltage. The inventor herein has therefore examined to mount a host interface module for an LPC (Low Pin Count) bus interface as a parallel interface in a PC (Personal Computer) (hereinbelow, also simply called an LPC module) on such a semiconductor integrated circuit. In a high-speed host interface specification such as the LPC, bus wiring is suppressed and, in addition, data communication is performed synchronously with a PCI (Peripheral Component Interconnect) clock of 33 MHz (external clock signal). Consequently, designing which is tighter with respect to signal propagation delay in a semiconductor integrated circuit is demanded. Regarding an external power supply as well, a small signal amplitude is realized by using a low-voltage power supply of 3.3V or the like. However, the inventor herein has found that delay in a data output timing from an external clock signal is increased by the output operation delay due to the level shift circuit and the propagation delay of the internal clock.

The inventor herein has consequently examined, against the output operation delay due to the level shift circuit, a countermeasure of bypassing the level shift circuit by master slice of a wiring layer since both of the internal circuit and the interface portion operate with only a low voltage in the case of assuring the operation of the LPC module. However, when the interface portion is operated with a high voltage such as 7.0V and the internal circuit is operated with a low voltage such as 4.6V in order to apply a high voltage to the MOS transistor having a high breakdown voltage at the time of burn-in, the level shifting function is not realized in the bypassed portion. Therefore, an intermediate potential is applied to a circuit like an inverter or clocked inverter which receives a small-amplitude signal and a shoot-through current flows in the interface portion. The shoot-through current causes shifting of a threshold voltage of a MOS transistor by hot carriers and destruction of a MOS transistor.

When a low voltage of about 4.6V is applied to both of the internal circuit and the interface portion at the time of burn-in, the problem does not occur. However, a sufficient voltage stress cannot be put on a MOS transistor having a high breakdown voltage, so that an initial failure cannot be found, and the possibility that the failure becomes apparent in the market after shipment becomes high. It is therefore unavoidable that reliability deteriorates. An external terminal for an LPC module is conformed with a PCI bus and is used in an environment where there is no termination using a reflection wave. In the worst case, a voltage twice as high as the power supply voltage is applied to the terminal. Consequently, the MOS transistor in the interface portion to be connected to the terminal is requested to have a high breakdown voltage.

Second, the external output operation delay due to the propagation delay of the clock signal was examined. For example, in an LPC module, output data has to be determined within predetermined permissible delay time since a rising change of a PCI clock of 33 MHz (external clock signal). It was found out by the inventor herein that, when the permissible delay time is shortened, if a clock signal generated by an internal CPG (Clock Pulse Generator) is used as a latch clock signal for data output, the output data may not be determined within the time.

An object of the present invention is to provide a semiconductor integrated circuit capable of realizing higher-speed external output operation synchronized with a clock signal from the viewpoints of prevention of the output operation delay due to a level shift circuit and maintenance of a high breakdown voltage of an output buffer.

Another object of the invention is to provide a semiconductor integrated circuit capable of realizing higher-speed external output operation synchronized with an external clock signal from the viewpoint of suppression of clock delay.

Further another object of the invention is to provide a burn-in method capable of improving reliability of burn-in in a semiconductor integrated circuit with higher speed of an external output operation synchronized with a clock from the viewpoint of prevention of output operation delay due to a level shift circuit and maintenance of a high breakdown voltage of an output buffer.

The above and other objects and novel features of the invention will become apparent from the description of the specification and the appended drawings.

The outline of representative ones of inventions disclosed in the specification will be briefly described as follows.

(1) A semiconductor integrated circuit of the invention achieved from the viewpoint of prevention of output operation delay due to a level shift circuit and maintenance of a high breakdown voltage of an output buffer includes a first circuit (4, 7) and a second circuit (3) having a breakdown voltage higher than a breakdown voltage of the first circuit, and operation voltages of the first and second circuits can be made equal to each other or different from each other. The second circuit has: a plurality of level shift circuits (34, 35, 54, 55) capable of shifting the level of an output of the first circuit in accordance with an operation voltage of the second circuit; a plurality of external output buffers (33, 53) receiving outputs of the level shift circuits; a bypass (70, 71) for bypassing an input of a predetermined level shift circuit (54, 55) to an input of a predetermined external output buffer (53); and a selecting circuit (74) for selecting connection of either the predetermined level shift circuit or a bypass to an input of the predetermined external output buffer.

In a use form in which the first and second circuits operate with a low voltage, the bypass in the predetermined level shift circuit is connected to the input of the predetermined external output buffer. An external interface using the external output buffer connected to the bypass is not influenced by the operation delay by level shifting. Thus, a high-speed interface with the outside can be realized.

In a use form using a high voltage for an external interface as a request on a system to which the semiconductor integrated circuit is applied, the first circuit is operated with a low voltage, the second circuit is operated with a high voltage, a level shift circuit is interposed without selecting a bypass also in the predetermined external output buffer, the signal amplitude of a low voltage in the first circuit is shifted to the signal amplitude of a high voltage of the second circuit, and the resultant signal is supplied to the external output buffer.

Also in the case of employing any of the use forms, at the time of burn-in, the first circuit is operated with a low voltage for burn-in, the second circuit is operated with a high voltage for burn-in, a bypass is not selected in the predetermined external output buffer but the level shift circuit is interposed, the signal amplitude of the low voltage for burn-in in the first circuit is shifted to that of the high voltage for burn-in of the second circuit, and the resultant is supplied to the external output buffer. Since a shoot-through current does not pass to the second circuit by an intermediate-level signal having a relatively small amplitude of the first circuit, deterioration in the characteristic or destruction of the second circuit caused by the shoot-through current does not occur. Therefore, burn-in can be carried out in the first and second circuits by using the operation powers adapted to the breakdown voltages of the circuits, so that reliability of burn-in can be guaranteed.

(2) The level shift circuit may be constructed by a plurality of level shift circuits having level shifting ranges which are different from each other. When the operation voltages of the first and second circuits are different from each other, to deal with a case where the difference between the operation voltages is large, it is sufficient to prepare a plurality of level shift circuits which are optimum to level shift ranges and select a level shift circuit to be used in accordance with an operation voltage difference at the time of actually operating a semiconductor integrated circuit.

(3) As a concrete form of the invention, when the semiconductor integrated circuit has an internal power step-down circuit for stepping down an input voltage from a first external terminal (VCC), the second circuit uses an input voltage supplied to the first external terminal as an operation voltage. The first circuit uses, as an operation power, a stepped-down output voltage of the internal power step-down circuit or an input voltage from a second external terminal (VCL).

When the operation voltage of the first circuit and that of the second circuit are made different from each other, an external power supply voltage is connected to a first terminal and a stabilized capacitative element is connected to a second terminal. When the operation voltage of the first circuit and that of the second circuit are made equal to each other, the same external power supply voltage is connected to the first and second terminals. At this time, the operation of the internal power step-down circuit may be stopped. Since power supply capability is low as compared with the external power supply circuit, even if the internal power step-down circuit operates, there is no harm.

The first circuit may have register means (94) for holding selection control information (87) of the selecting circuit.

The first circuit has, for example, an output latch circuit (90) for latching output data of the predetermined external output buffer synchronously with a clock signal (104, 105) and a data processing circuit (20) for processing data to be latched by the output latch circuit.

The output latch circuit may be a part of a predetermined IO port or a dedicated circuit neighboring to the predetermined external output buffer. By disposing the output latch circuit adjacent to the external output buffer, propagation delay of latch data to the external output buffer can be reduced.

The clock signals may be supplied from the outside in parallel to the output latch circuit and the data processing circuit. When the output latch circuit receives a clock signal from the outside and performs the output latching operation, an influence of the clock delay in the output operation synchronized with the external clock signal can be reduced.

As a further concrete form, the data processing circuit is a host interface control circuit. For example, the host interface control circuit and the output latch circuit operate synchronously with the external clock signal of 33 MHz.

(4) In a burn-in method according to the invention of performing burn-in in a semiconductor integrated circuit including a first circuit and a second circuit having a breakdown voltage higher than a breakdown voltage of the first circuit, in which operation voltages of the first and second circuits can be made equal to each other or different from each other, and the second circuit includes a level shift circuit capable of shifting the level of an output of the first circuit in accordance with an operation voltage of the second circuit, an external output buffer receiving an output of the level shift circuit, and a bypass for selectively bypassing an input of a predetermined level shift circuit to an input of the external output buffer, operation voltages of the first and second circuits are made different from each other and no bypass selection is set in the bypass.

(5) A semiconductor integrated circuit according to the invention achieved from the viewpoint of suppression of clock delay has an external output buffer (53), a latch circuit (90) for latching data to be output from the external output buffer synchronously with an external clock signal (100), and a circuit (20) for processing data to be latched by the latch circuit. The latch circuit and the processing circuit commonly receive an output of a clock buffer (101) receiving the external clock signal.

The latch circuit receives a clock signal from the outside and performs an output latch operation, thereby enabling an influence of the internal clock delay in output operation synchronized with an external clock signal to be reduced.

When the latch circuit is disposed close to the external output buffer, the propagation delay of latch data to the external output buffer can be reduced.

It is also possible to provide an IO port (93) capable of latching data to be output from the external output buffer synchronously with an internal clock signal and selectively switch operation of the IO port and operation of the latch circuit.

(6) A semiconductor integrated circuit achieved from further another viewpoint of the invention has: a central processing unit; a clock generating circuit receiving a reference clock and generating an operation clock to be supplied to the central processing unit; an internal bus coupled to the central processing unit; a host interface module coupled to the internal bus, having a plurality of output buffers, a plurality of latch circuits for latching data to be output from the plurality of output buffers synchronously with an external clock signal, and a processing circuit for processing data to be latched by the plurality of latch circuits; and an external terminal to which the external clock signal is supplied from the outside. The plurality of latch circuits are disposed near the plurality of output buffers, and the external clock signal supplied to the external terminal is commonly input to the plurality of latch circuits.

As a concrete mode, the host interface module may be a host interface module for an LPC (Low Pin Count) bus interface.

As another concrete mode, the semiconductor integrated circuit may have an IO port capable of latching data to be output from the plurality of output buffers synchronously with an internal clock signal which is output from the clock generating circuit, and operation of the IO port and operation of the latch circuit can be selectively switched.

Further, the semiconductor integrated circuit may have an AD converter coupled to the internal bus, for converting an analog signal supplied from the outside to a digital signal, and the host interface module may supply the digital signal converted by the A/D converter to a host processor to be coupled to the semiconductor integrated circuit.

BRIEF DESCRIPTION OF THE DRAWINGS

FIG. 7 is an explanatory diagram illustrating the corresponding relation between the valid/invalid state of LPC communication and an operation power supply.

FIG. 14 is an explanatory diagram illustrating a correspondence relation between the valid/invalid state of LPC communication and an operation power supply in the semiconductor integrated circuit of FIG. 13.

DETAILED DESCRIPTION OF THE PREFERRED EMBODIMENTS

Figure 1:
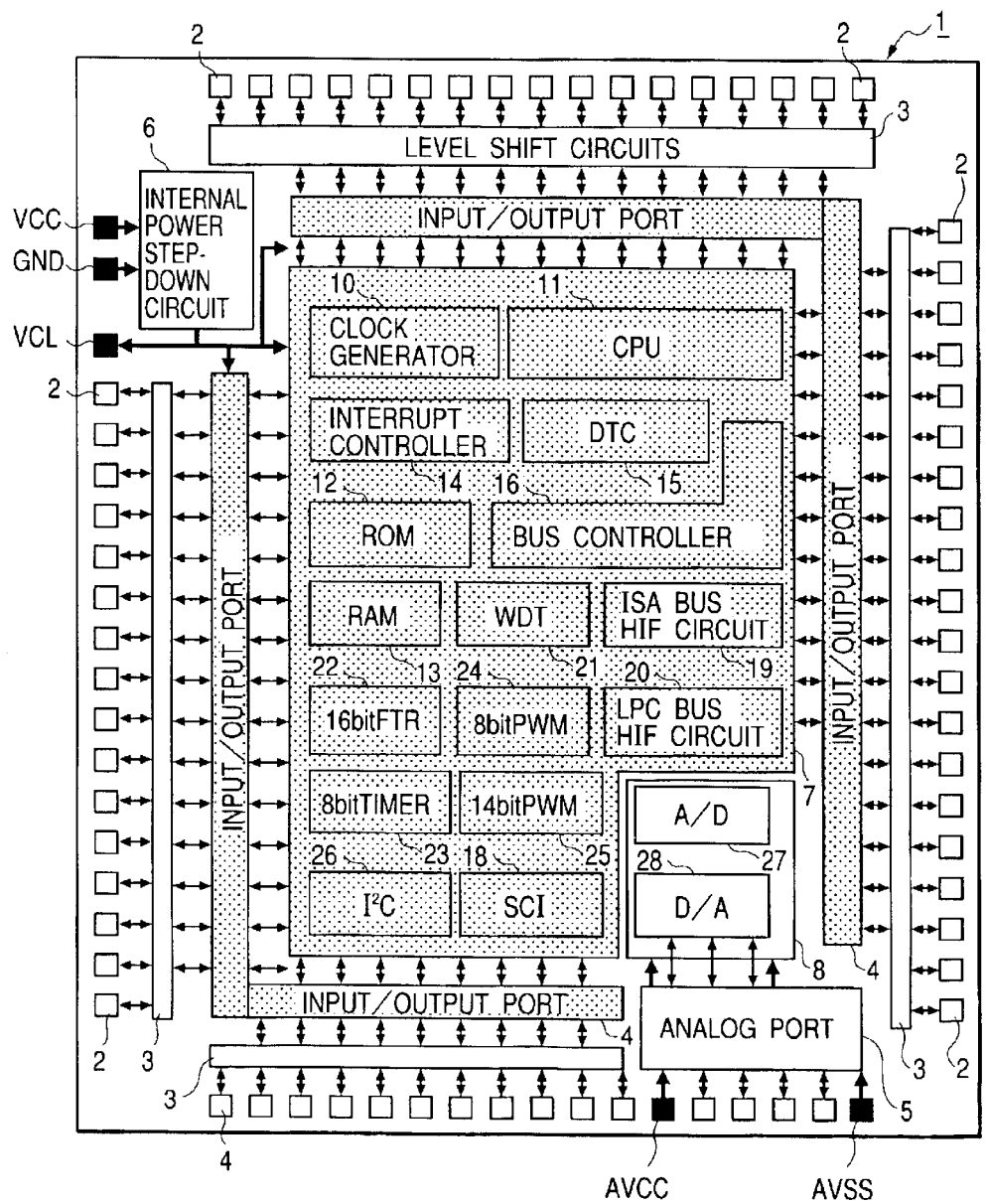
FIG. 1 is a block diagram showing a microcomputer as an example of a semiconductor integrated circuit according to the invention.

FIG. 1 shows a microcomputer as an example of a semiconductor integrated circuit according to the invention. A microcomputer 1 shown in the diagram is formed on a semiconductor substrate (chip) made of single crystal silicon or the like by, for example, a known CMOS integrated circuit fabricating technique. Although not limited, a number of output terminals 2 such as bonding pads are disposed around the chip. On the inside of the output terminals 2, a buffer portion 3, an input/output port 4, an analog port 5, and an internal power step-down circuit 6 are disposed. In the center portion, an internal digital portion 7 and an analog portion 8 are disposed.

The input/output port 4 and the internal digital portion 7 form a first circuit constructed by a MOS transistor having a relatively low breakdown voltage, and the like. On the other hand, the buffer portion 3 forms a second circuit of a high breakdown voltage, which is constructed by a MOS transistor having a relatively high breakdown voltage, and the like. Each of the analog port 5, internal power step-down circuit 6, and analog portion 8 is constructed by a MOS transistor having a relatively high breakdown voltage, and the like.

The internal digital portion 7 has: a clock generator 10 for generating an internal operation clock signal on the basis of an oscillator or a reference system clock signal, a central processing unit (CPU) 11, a ROM 12 holding, for example, an operation program of the CPU 11, a RAM 13 used as, for example, a work area of the CPU 11, an interrupt controller 14 for controlling interruption to the CPU 11 in response to an exceptional process request and an interrupt processing request, a data transfer controller (DTC) 15 for performing data transferring control in accordance with initial setting by the CPU 11, and a bus controller 16 for performing bus control on internal and external buses in response to an accessing operation by the CPU 11 or data transfer controller 15. Further, the internal digital portion 7 has a serial communication interface (SCI) controller 18 as an IO controller (input/output control circuit), an ISA (Industry Standard Architecture) bus HIF (Host Interface) circuit 19, and an LPC bus HIF circuit (also called an LPC bus interface module) 20. In addition, the internal digital portion 7 has a watch dog timer (WDT) 21, a 16-bit free running timer 22, an 8-bit timer 23, an 8-bit PWM (Pulse Width Modulator) 24, a 14-bit PWM 25, and an I2C (Inter IC) 26.

The analog portion 8 has an analog/digital (A/D) converter 27 and a digital/analog (D/A) converter 28.

The microcomputer 1 has, as terminals for power supply, a power supply terminal VCC, a ground terminal GND of the circuit, a terminal VCL for low-voltage operation, an analog power supply terminal AVCC, and an analog ground terminal AVSS. The analog power supply terminal AVCC and analog ground terminal AVSS are dedicated to the analog port 5 and analog portion 8.

The operation power supplied from the power supply terminal VCC is supplied to the buffer portion 3 and internal power step-down circuit 6. The internal power step-down circuit 6 steps down the voltage of the operation power supplied from the power supply terminal VCC and supplies the stepped-down voltage as a step-down power of the input/output port 4 and internal digital portion 7. The terminal VCL for low-voltage operation is connected to a path of supplying the step-down power. The microcomputer 1 are adapted to both of the high-voltage operation which is performed with a relatively high voltage received by the power supply terminal VCC and the low-voltage operation which is performed with a relatively low voltage received by the power supply terminal VCC.

Figure 2:
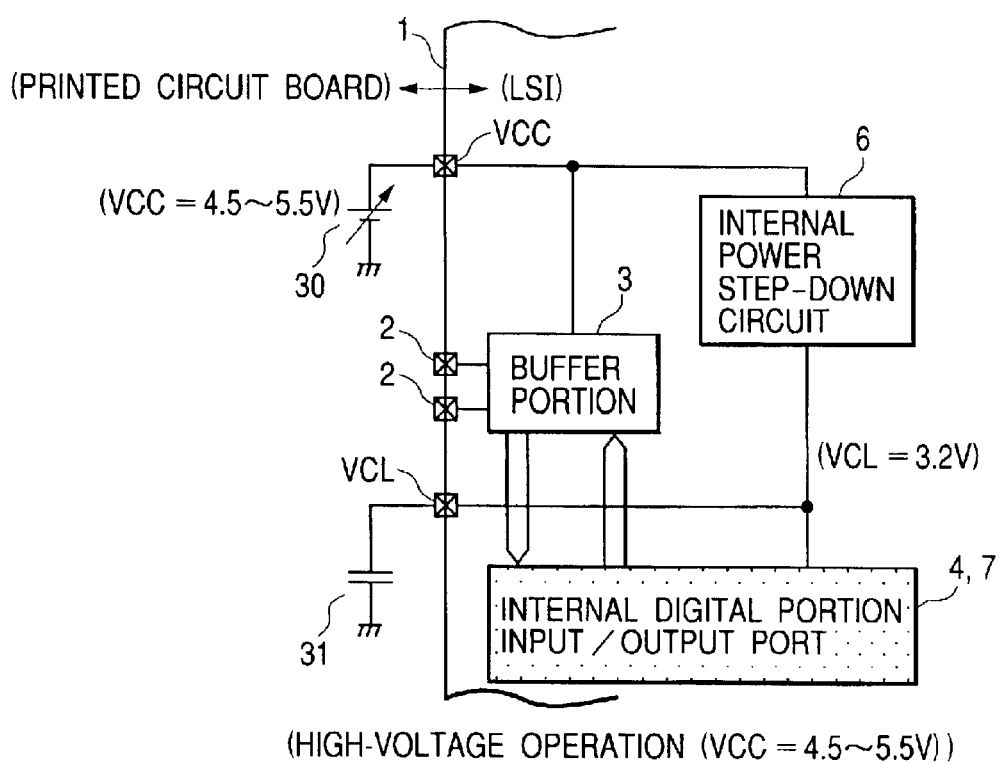
FIG. 2 is an explanatory diagram illustrating a power supply terminal connection form in a high-voltage operation of the microcomputer.

FIG. 2 illustrates the power supply terminal connection form at the time of the high-voltage operation of the microcomputer. An external power of 4.5 to 5.5V is supplied from an external power supply circuit 30 to the power supply terminal VCC. The internal power step-down circuit 6 outputs a stepped-down voltage which is stepped down to, for example, about 3.2V. A stabilized capacitative element 31 (for example, 0.1 μF) is connected to the terminal VCL for low-voltage operation. With the configuration, the buffer portion 3 operates on an external power source of 4.5 to 5.5V, and the input/output port 4 and internal digital portion 7 operate with a stepped-down voltage of about 3.2V.

Figure 3:
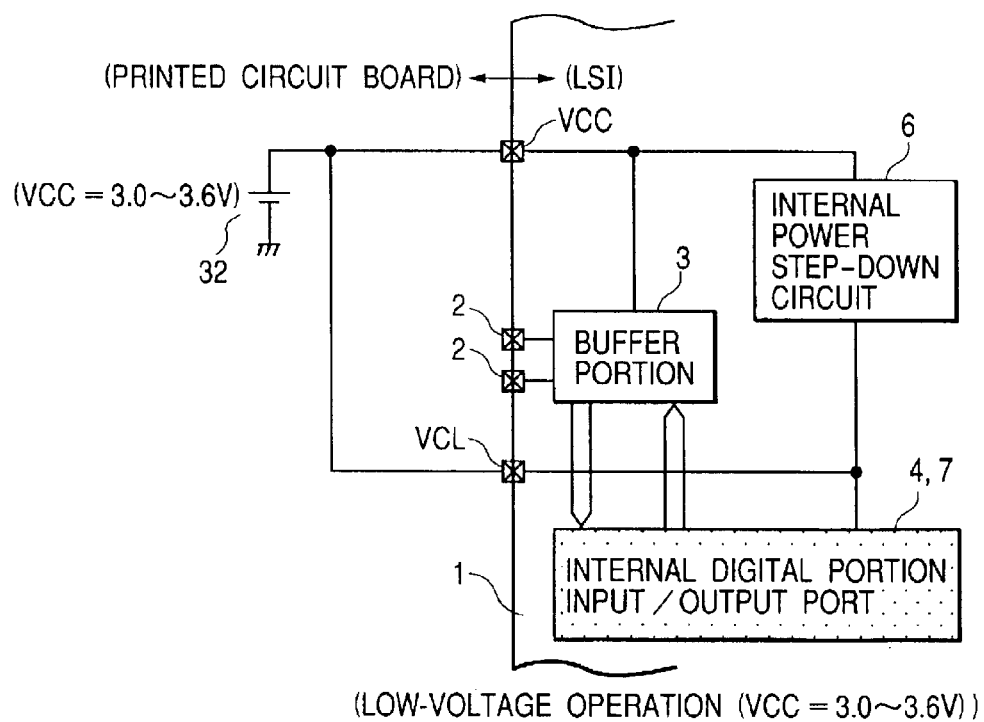
FIG. 3 is an explanatory diagram illustrating a power supply terminal connection form in a low-voltage operation of the microcomputer.

FIG. 3 illustrates a power supply terminal connection form in the low-voltage operation of the microcomputer. To the power supply source VCC and the terminal VCL for low-voltage operation, an external power of 3.0 to 3.6V is supplied from an external power supply circuit 32. It is preferable to stop the stepping-down operation of the internal power step-down circuit 6. However, since the power supply capability of the internal power step-down circuit 6 is lower than that of the external power supply circuit 32, even if the internal power step-down circuit 6 operates, there is no substantial harm. With the configuration, the buffer portion 3, input/output port 4 and internal digital portion 7 operate on the relatively-low external power supply of 3.0 to 3.6V.

Figure 4:
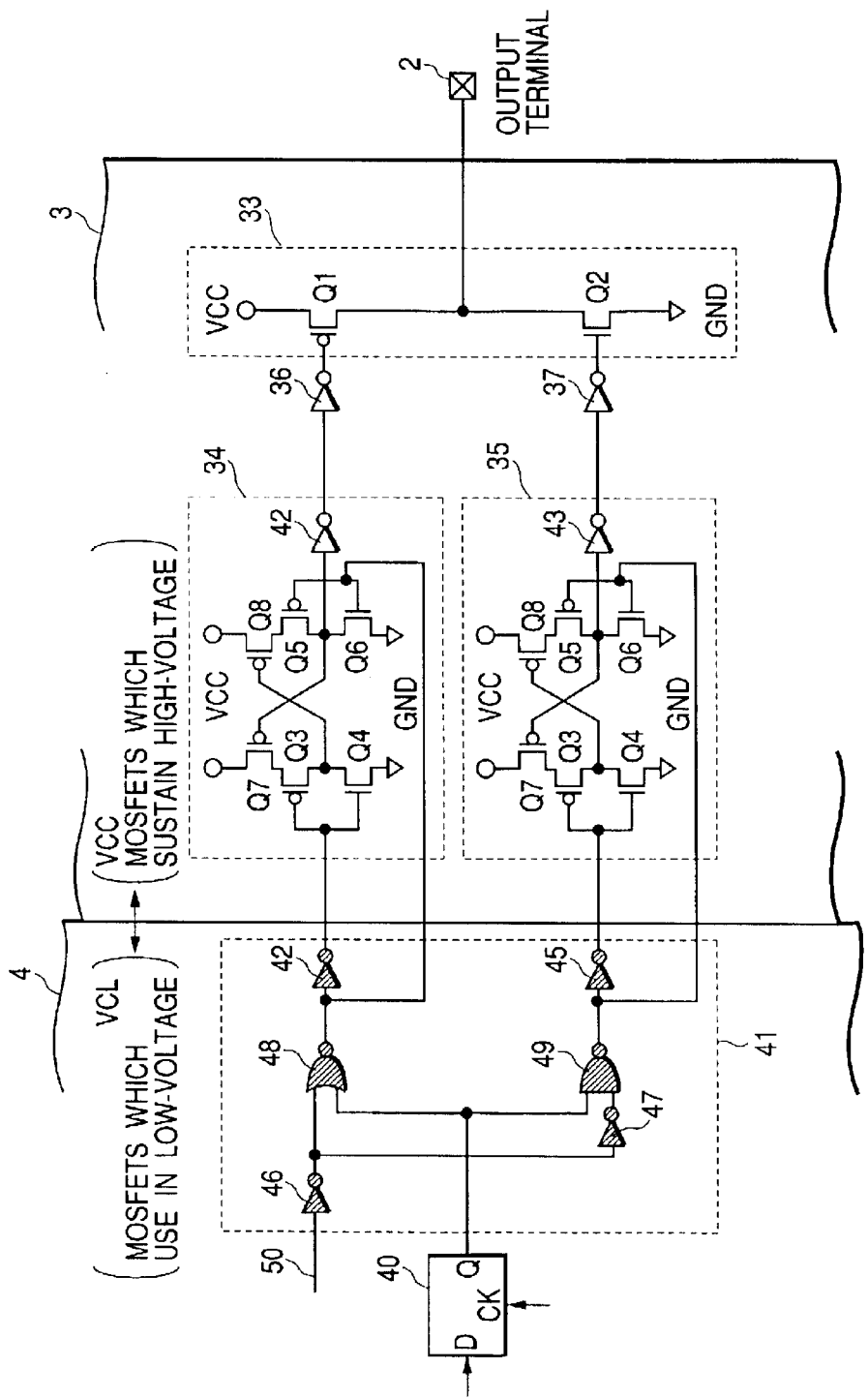
FIG. 4 is a circuit diagram illustrating an output buffer and a level shift circuit in a buffer portion.

FIG. 4 illustrates an output buffer and a level shift circuit in the buffer portion 3. An output buffer 33 is constructed by a CMOS inverter formed by a p-channel type MOS transistor Q1 and an n-channel type MOS transistor Q2. The gate electrodes of the MOS transistors Q1 and Q2 receive outputs of level shift circuits 34 and 35 via inverters 36 and 37, respectively. Data latched by an output latch circuit 40 of the input/output port 4 is supplied to the level shift circuits 34 and 35 via an output control circuit 41. In the high-voltage operation, each of the level shift circuits 34 and 35 receives a signal of a relatively small amplitude which is equal to that of the stepped-down voltage, shifts the amplitude to that of the external power supply voltage, and outputs the resultant. For example, when MOS transistors Q3 and Q4 receive the high-level of the stepped-down voltage in the level shift circuit 34 and MOS transistors Q5 and Q6 receive the low level, the MOS transistor Q4 is turned on, MOS transistors Q3 and Q7 are turned off, the MOS transistor Q6 is turned off, and the MOS transistors Q5 and Q8 are turned on, and the high level of the external power supply voltage is obtained at the common drain of the MOS transistors Q5 and Q6. By the level shifting function, erroneous operation and occurrence of an undesired shoot-through current caused when a circuit using the external power supply as an operation power supply receives the high level of the stepped down voltage as an intermediate level in the buffer portion 3 can be suppressed.

Although substantial level shifting is not performed between an input and an output of the level shift circuit at the time of the low-voltage operation, to determine an output logic value which responds to an input, the input has to be subjected to a static latch operation in the level shift circuit. It causes a delay in the output operation.

In FIG. 4, reference numerals 42 and 43 denote inverters. The output control circuit 41 is constructed by inverters 44 to 47, a 2-input NOR gate 48, and a 2-input NAND gate 49. The output control circuit 41 makes the output buffer 33 have a high output impedance with the low level of a control signal 50, and enables latch data output operation to be performed by the output buffer 33 with the high level of the control signal 50.

Figure 5:
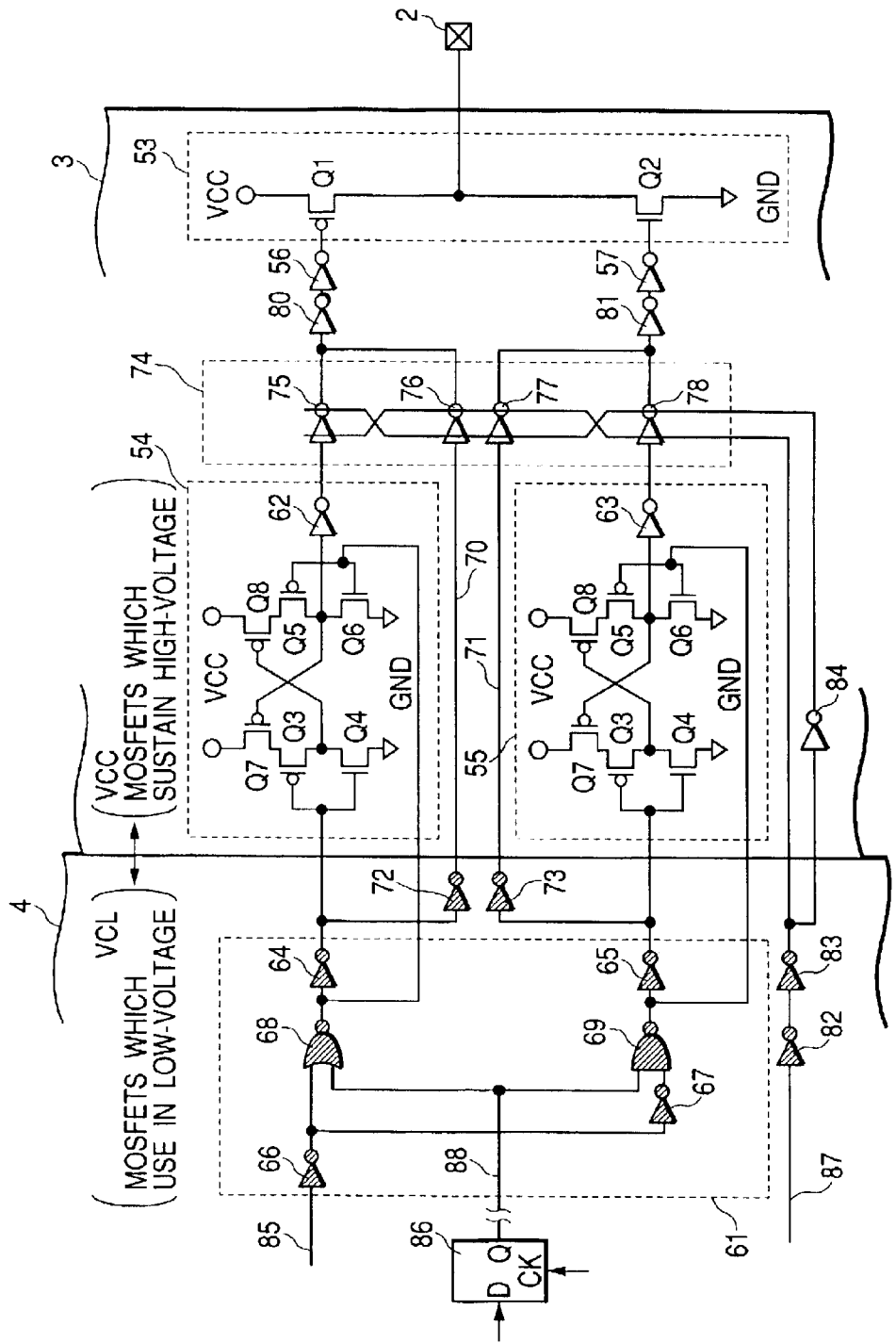
FIG. 5 is a circuit diagram illustrating an output buffer and a level shift circuit assigned to an output of an LPC bus HIF circuit in the buffer portion.

FIG. 5 illustrates an output buffer and a level shift circuit assigned to an output of the LPC bus HIF circuit 20 in the buffer portion 3. The configuration shown in the drawing basically has an output buffer 53, level shift circuits 54 and 55, and an output control circuit 61 each having the same configuration as that of a corresponding component in FIG. 4 and has, in addition, bypasses 70 and 71 and a selecting circuit 74.

The bypasses 70 and 71 bypass inputs of the level shift circuits 54 and 55 to the inputs of the output buffer 53 via inverters 72 and 73. The selecting circuit 74 is a circuit for selecting connection of either the level shift circuits 54 and 55 or bypasses 70 and 71 to the output buffer 53. The selecting circuit 74 has clocked inverters 75 and 76 which can exclusively perform output operation to select connection of either the level shift circuit 54 or bypass 70. Outputs of the clocked inverters 75 and 76 are connected to the gate electrode of the MOS transistor Q1 via inverters 80 and 56. The selecting circuit 74 also has clocked inverters 77 and 78 which can exclusively perform output operation to select connection of either the level shift circuit 55 or the bypass 71. Outputs of the clocked inverters 77 and 78 are connected to the gate electrode of the MOS transistor Q2 via inverters 81 and 57.

The operation of the clocked inverters 75 to 78 is selected by a control signal 87. The control signal 87 is converted to a complementary signal via inverters 82 to 84 and the complementary signal is supplied to the clocked inverters 75 to 78. When the control signal 87 is at the high level, the bypasses 70 and 71 are selected. When the control signal 87 is at the low level, outputs of the level shift circuits 54 and 55 are selected.

In FIG. 5, the output control circuit 61 is constructed by inverters 64 to 67, a 2-input NOR gate 68, and a 2-input NAND gate 69. The output control circuit 61 makes the output buffer 53 have a high output impedance by the low level of a control signal 85 and enables the output buffer 53 to output data 88 by the high level of the control signal 85. The data 88 is output from an output latch circuit 86 representatively shown. The output latch circuit 86 latches data synchronously with a clock signal supplied to a clock terminal CK.

Figure 6:
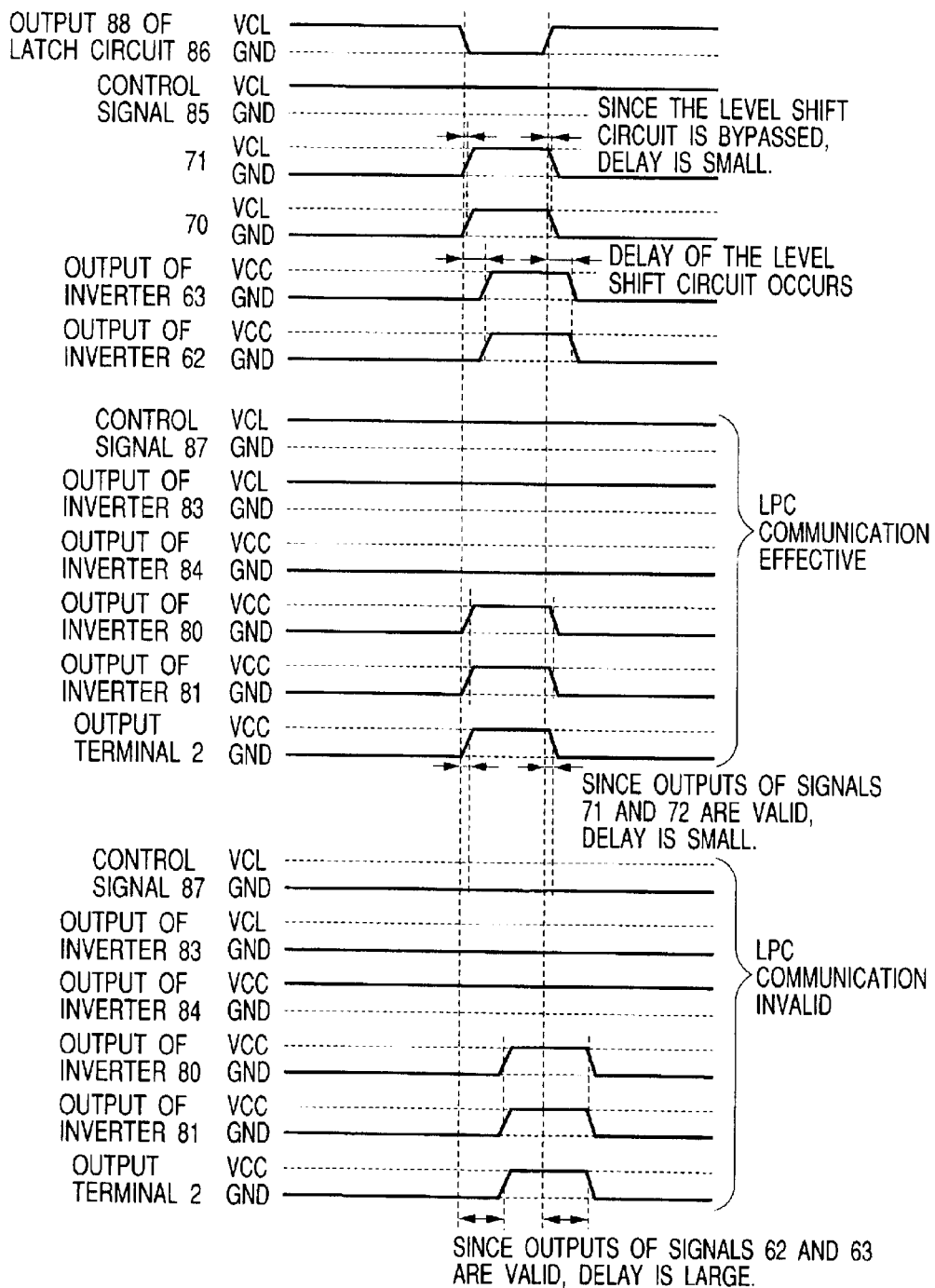
FIG. 6 is a signal waveform chart illustrating a signal waveform in the buffer portion of FIG. 5.

FIG. 6 illustrates signal waveforms in the buffer portion 3 in FIG. 5. When the output waveforms of the bypasses 70 and 71 are compared with outputs of inverters 62 and 63 in the level shift circuits 54 and 55, although outputs of the level shift circuits 54 and 55 are delayed by the operation delay, no delay due to the operation delay occurs in the bypasses 70 and 71.

At the time of performing a host interface control using the LPC bus HIF circuit 20 (when the LPC communication is valid), by selecting the bypasses 70 and 71 by the high-level control signal 87, the latched data is output from the output terminal 2 at a timing relatively earlier than an output operation timing of the latch circuit 86 (change in a clock specifying the operation of latching the data 88 by the latch circuit 86) for the reason that the output path of the latched data at this time is not influenced by the operation delay of the level shift circuits 54 and 55.

When the host interface control using the LPC bus HIF circuit 20 is not performed (when the LPC communication is invalid), by selecting the level shift circuits 54 and 55 by the low-level control signal 87, the latched data is output from the output terminal 2 at a timing delayed from the output operation timing of the latch circuit 86 (change in a clock specifying the latching operation) for the reason that the influence of the operation delay of the level shift circuits 54 and 55 is exerted in this case.

FIG. 7 illustrates the correspondence relation between the valid/invalid state of the LPC communication and the operation power source. The operation status is roughly divided into burn-in and the normal operation (operation status other than burn-in), and the normal operation is roughly divided into an LPC communication valid state and an LPC communication invalid state. When the LPC communication is valid in the normal operation, a low-voltage operation status is obtained in which a low voltage such as 3.3V is supplied to the terminals VCC and VCL to operate the buffer portion 3, input/output port 4, and internal digital portion 7 with the low-voltage power of 3.3V or the like. In the case of performing the host interface control using the LPC bus HIF circuit 20 in the operation status, when the control signal 87 is set to the high level (3.3V in this case), in the buffer portion 3 for the interface, the clocked inverters 76 and 77 in the selecting circuit 74 are turned on, the clocked inverters 75 and 78 are turned off, and the bypasses 70 and 71 are selected, thereby enabling the high-speed LPC bus interface to be realized. As for the buffer portion for the external interface other than the LPC bus interface, also in the low-voltage operation status, an output signal passes through the level shift circuit. In this case, in the external interface other than the LPI bus interface, an output timing which is tight to a degree that the operation delay of the level shift circuit is an issue is not demanded.

When the LPC communication in the normal operation is invalid, a high-voltage operation status is obtained in which an external power of 5.0V is applied to the terminal VCC, stabilized capacitance is coupled to the terminal VCL, the buffer portion 3 is operated on the external power supply, and the input/output port 4 and the internal digital portion 7 operate with an internal stepped-down voltage of 3.2V or the like. In the operation status, the control signal 87 is set to the low level (0V in this case). In the buffer portion 3, the clocked inverters 76 and 77 in the selecting circuit 74 are turned off, the clocked inverters 75 and 78 are turned on, outputs of the level shift circuits 54 and 55 are selected, the small amplitude of the stepped-down voltage is increased the amplitude of the external power by the level shift circuits 54 and 55, and the resultant is output from the output buffer 53 to the output terminal 2. Therefore, the invention can be applied to the data processing system using a relatively high operation voltage such as 5V.

In the case where the LPC communication is used in any of the valid and invalid states in the normal operation, at the time of burn-in, a high voltage for burn-in such as 7.0V is applied to the power supply terminal VCC, the control signal 87 is set in the low level like in the state where the LPC communication in the normal operation is invalid, and the shifting function of the level shift circuits 54 and 55 is made valid. Therefore, for the input/output port 4 and the internal digital portion 7 of a relatively low breakdown voltage, burn-in can be carried out with a relatively low voltage of about 4.6V. For the buffer portion 3 having a relatively high breakdown voltage, burn-in can be carried out with a relatively-high external power supply voltage of about 7.0V. Thus, the reliability of burn-in can be guaranteed also for the circuit 3 of a high breakdown voltage. Moreover, since the input/output port 2 which operates with a low voltage is connected to the buffer portion 3 which operates with a high voltage via the level shift circuits 54 and 55, a situation that a signal of an intermediate level is continuously supplied from the input/output port 2 directly to the inverter of the buffer portion 3 does not occur.

Figure 8:
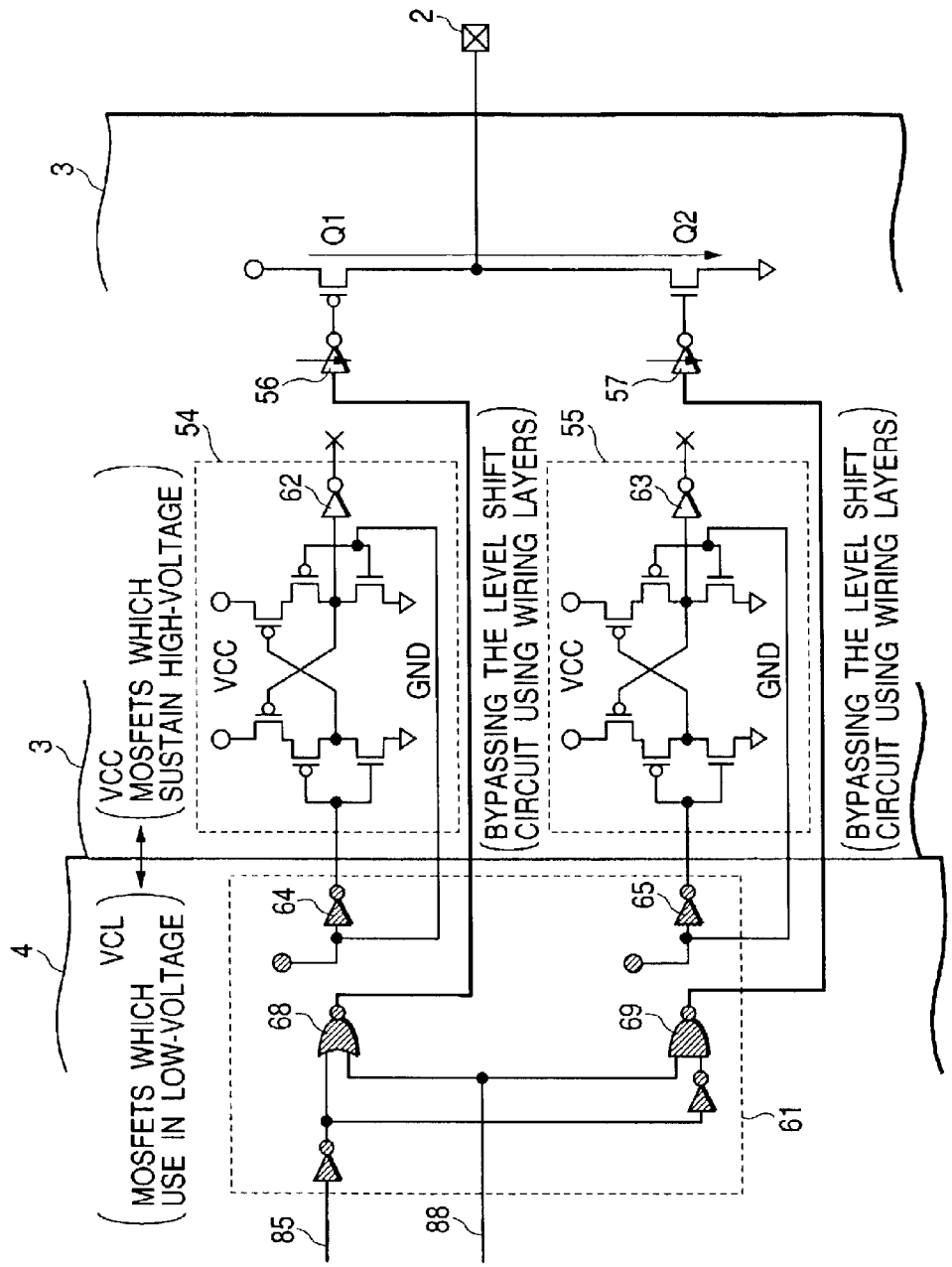
FIG. 8 is a circuit diagram showing, as a comparative example of FIG. 5, a case where the LPC communication is valid in a normal operation in a microcomputer which does not employ a bypass for an LPC bus interface.

FIG. 8 shows, as a comparative example of FIG. 5, a case where the valid LPC communication is made valid in the normal operation in a microcomputer which does not employ a bypass for the LPC bus interface. In FIG. 8, inputs of the inverters 64 and 65 are pulled up, outputs of the inverters 62 and 63 are floated, an output of the NOR gate 68 is bypassed to the input of an inverter 56 by wiring, and an output of the NAND gate 69 is bypassed to the input of the inverter 57 by wiring. A process such as the bypassing is selected by a fixed method in a process such as wiring master slicing. In such a manner, in a use form where the LPC communication of the low-voltage operation is valid, the operation delay of the level shift circuits 54 and 55 does not exert an influence on the data outputting operation for the LPC interface. However, at the time of burn-in, if a burn-in voltage of about 7.0V is applied to the external terminal VCC to set a high-voltage operation status in a manner similar to the burn-in of FIG. 5, stress of the high voltage can be applied to the buffer portion 3. However, an intermediate level signal having a voltage amplitude of about 4.6V is input to the gates of the inverters 56 and 57 via wiring for bypass, a shoot-through current passes into the inverters 56 and 57, and it causes a change in the threshold voltage or a fear of destruction. There is no such a fear in the microcomputer employing the bypasses 70 and 71 for the LPC bus interface and the selecting circuit 74 as shown in FIG. 5.

Figure 9:
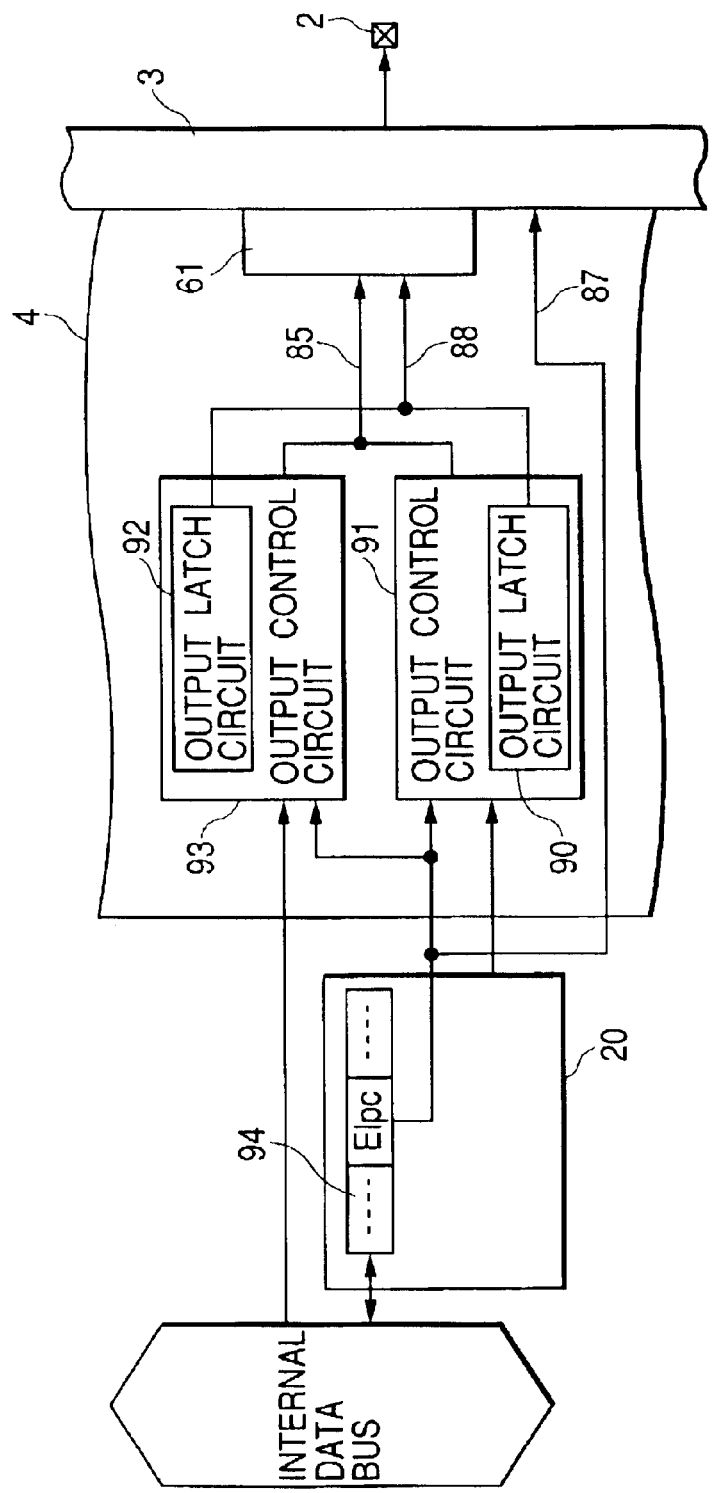
FIG. 9 is an explanatory diagram illustrating a connection relation between the circuit configuration of FIG. 5 and the LPC bus HIF circuit.

FIG. 9 illustrates a connection relation between the circuit configuration of FIG. 5 and the LPC bus HIF circuit 20. In correspondence with the circuit configuration of FIG. 5, the input/output port 4 has, for example, an output control circuit 91 including an output latch circuit 90 for LPC and an output control circuit 93 including an output latch circuit 92 for general purpose. The output control circuit 91 is connected to the LPC bus HIF circuit 20 and dedicated. The output control circuit 93 can be connected to other peripheral circuits such as the 8-bit timer 23 via an internal data bus and is used for general purpose.

The LPC bus HIF circuit 20 has a control register 94 including a control bit such as an LPC enable bit Elpc. When Elpc="1 (high level)", valid LPC communication is set. When Elpc="0 (low level)", invalid LPC communication is set. The LPC enable bit Elpc is supplied to the output control circuits 91 and 93 and is also supplied as the control signal 87 to the selecting circuit 74.

At the time of the valid LPC communication instructed by Elpc="1" (87="1"), the output control circuit 91 for LPC is made operative and the output control circuit 93 for general purpose is made inoperative. At this time, the bypasses 70 and 71 are selected by the high-level control signal 87, the level shifting function is made invalid, and a state in which a high-speed output operation can be performed by the low-voltage operation. On the other hand, at the time of the invalid LPC communication instructed by Elpc="0" (87="0"), the output control circuit 91 for LPC is made inoperative and the output control circuit 93 for general purpose is made operative. At this time, the level shifting function of the level shift circuits 54 and 55 is made valid by the low-level control signal 87 and a state in which the level shifting output operation can be performed by the high-voltage operation is set.

The microcomputer used to make the LPC communication valid receives the supply of the operation power in the low-voltage operation form. At the time of the valid LPC communication instructed by Elpc="1" (87="1"), the output control circuit 91 for LPC is made operative, and the output control circuit 93 for general purpose is made inoperative. When the output control circuit 91 is made operative, interface data from the LPC bus HIF circuit 20 is latched by the output latch circuit 90 synchronously with a clock signal, and the output gate circuit 61 is controlled so as to perform output operation by the control signal 85 so that the data 88 can be output from the output buffer 53. Since the selecting circuit 74 selects the bypasses 70 and 71 by the control signal 87 at this time, the output operation of the output buffer 53 is not influenced by the operation delay of the level shift circuits 54 and 55 and is performed at higher speed. When the output control circuit 93 for general purpose is made inoperative, the output terminal of the control signal 85 and the data 88 is controlled to a high output impedance state.

On the other hand, the microcomputer at the time of the invalid LPC communication receives the supply of the operation power in the high-voltage operation form. At the time of the invalid LPC communication instructed by Elpc="0" (87="0"), the output control circuit 93 for general purpose is made operative, and the output control circuit 91 for LPC is made inoperative. When the output control circuit 93 is made operative, interface data supplied from a predetermined peripheral circuit via an internal data bus is latched by the output latch circuit 92 synchronously with a clock signal, and the output gate circuit 61 is controlled so as to perform output operation by the control signal 85 so that the data 88 can be output from the output buffer 53. Since the selecting circuit 74 selects the level shift circuits 54 and 55 by the control signal 87, the output operation of the output buffer 53 is influenced by the operation delay of the level shift circuits 54 and 55. However, the output operation is performed via level shifting from the stepped-down voltage amplitude to the external voltage amplitude and, after that, the resultant is output. When the output control circuit 91 for LPC is made inoperative, the output terminal of the control signal 85 and the data 88 is controlled to a high output impedance state.

Figure 10:
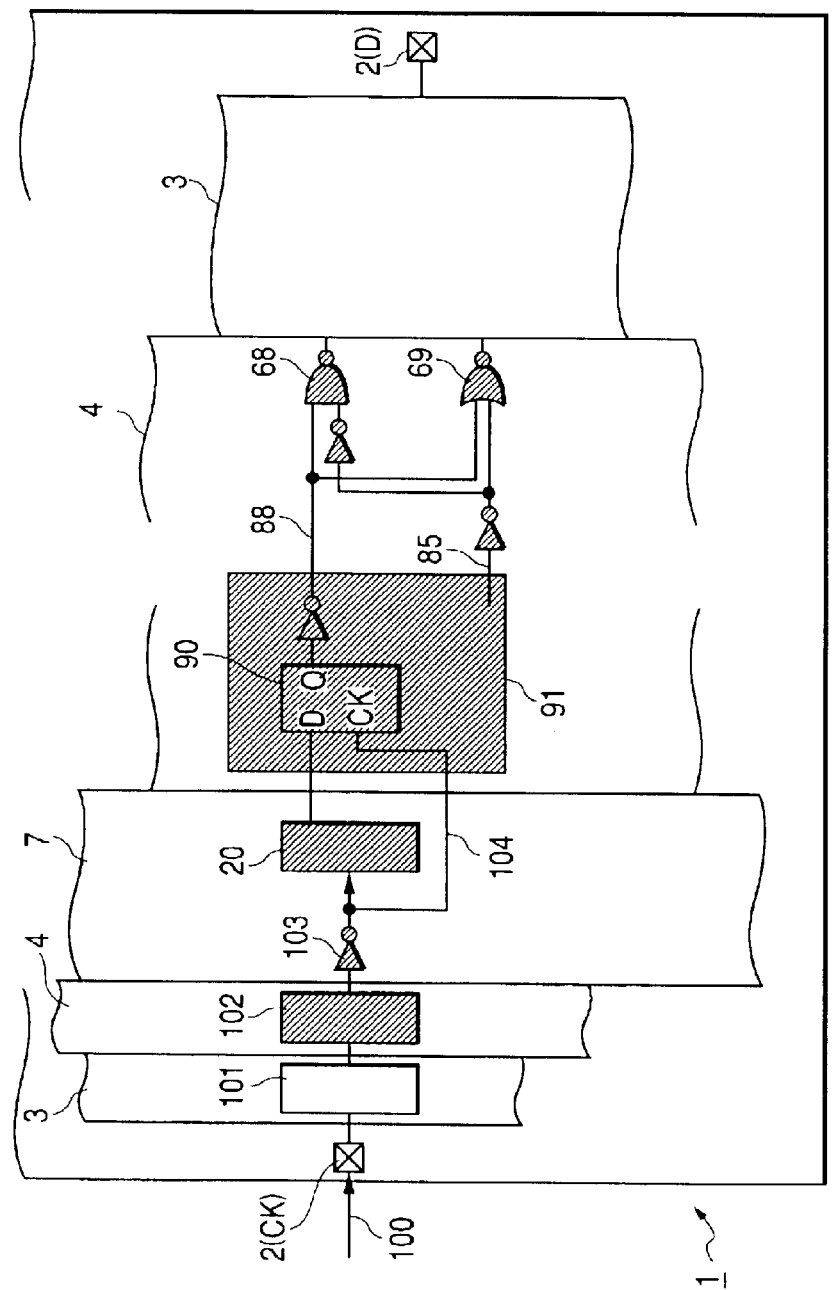
FIG. 10 is a block diagram illustrating a transmission system of a latch clock signal to an output latch circuit for the LPC bus interface.

FIG. 10 illustrates a transmission system of a latch clock signal to the output latch circuit 90 for the LPC bus interface. In FIG. 10, a PCI clock signal 100 for the LPC bus interface is input from a clock input terminal 2 (CK), and an internal clock signal 104 is supplied to the LPC bus HIF circuit 20 via a clock input buffer 101 of the buffer portion 3, a clock input port 102 of the input/output port 4, and a clock driver 103. The LPC bus HIF circuit 20 performs a bus interface control synchronously with the internal clock signal 104 and outputs output data to the output latch circuit 90. The output latch circuit 90 receives the internal clock signal 104 by a clock terminal CK and performs a latching operation. The data 88 latched by the output latch circuit 90 synchronously with the clock signal 104 is output to the data output terminal 2(D) via the buffer portion 3. In the clock signal transmission system, delay elements used at the time of outputting data from the data output terminal 2(D) synchronously with a change in the PCI clock signal 100 are clock delay which occurs in the range from the clock input terminal 2 (CK) to the clock input terminal CK of the output latch circuit 90 and propagation delay of data which occurs in the range from the output latch circuit 90 to the data output terminal 2 (D). The data propagation delay is reduced by using the bypasses 70 and 71 which can be selected by the selecting circuit 74. To reduce the clock delay, it is sufficient to decrease the number of gate stages in the clock transmission path.

Figure 11:
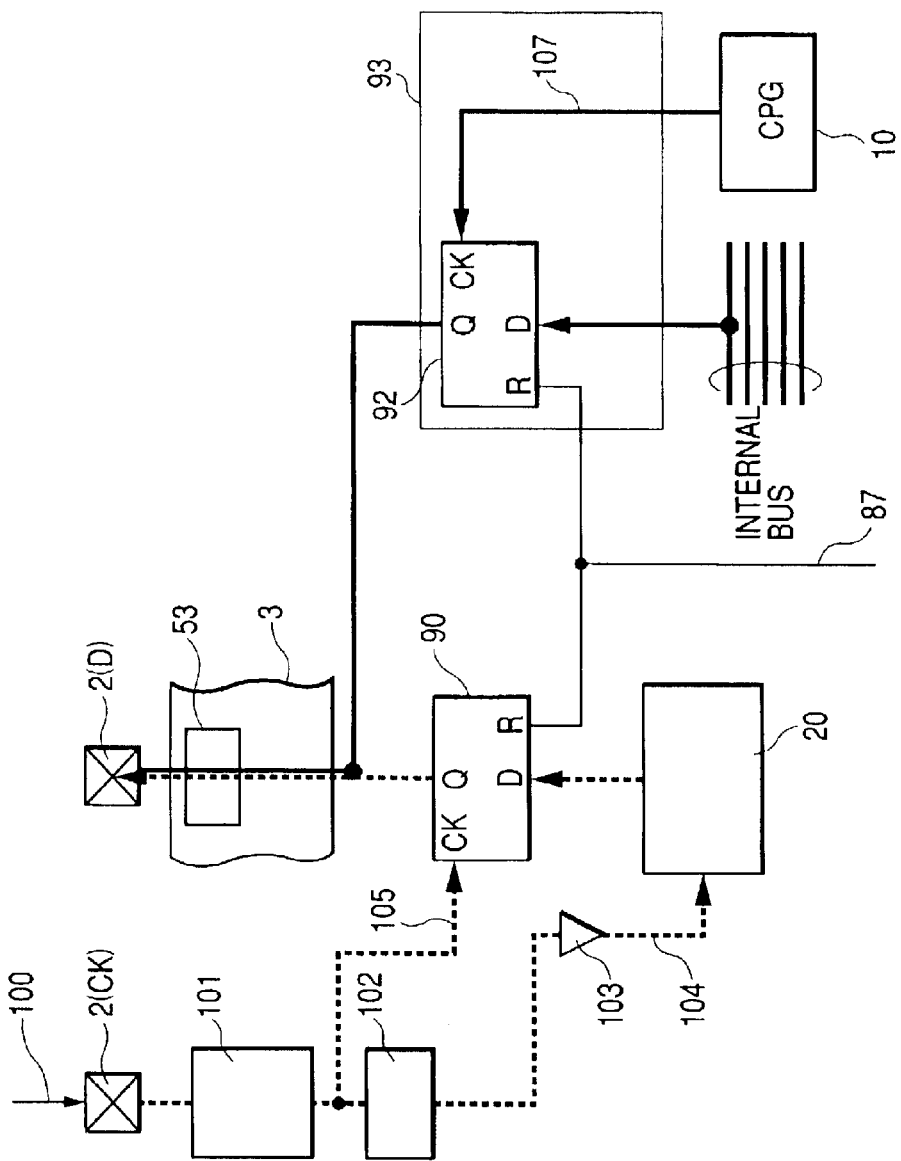
FIG. 11 is a block diagram showing an example in which clock delay and data propagation delay are further improved.

FIG. 11 illustrates an example of further reducing the clock delay and the data propagation delay. In order to further reduce the clock delay for data output operation for the LPC bus interface, the output latch circuit 90 is disposed near the clock input buffer 101 of the PCI clock signal 100, and a clock signal 105 output from the clock input buffer 101 is supplied to the output latch circuit 90. In order to further reduce the data propagation delay, the output latch circuit 90 is disposed very close to the output buffer 53, that is, very close to the data output terminal 2(D). To the output data latch circuit 92 used for general input and output, an internal clock signal 107 generated by the built-in clock generator 10 is supplied. In FIG. 11, the output data latch circuit 90 can output latched data when the control signal 87 is at the high level, and is set in a high output impedance state when the control signal 87 is at the low level. The output data latch circuit 92 can output latched data when the control signal 87 is at the low level, and is set in a high output impedance state when the control signal 87 is at the high level.

Figure 12:
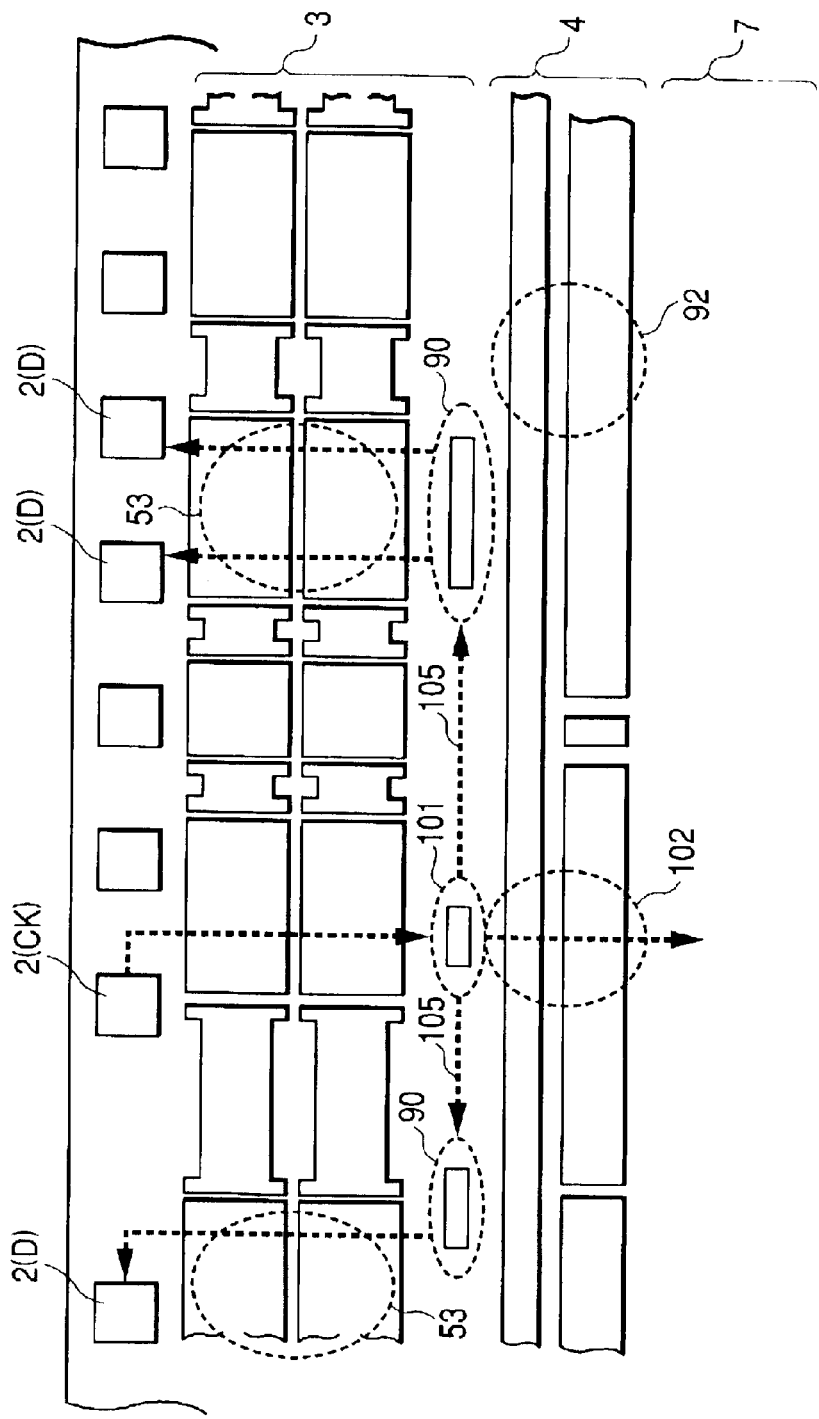
FIG. 12 is a schematic plan view illustrating the layout of a portion around the buffer portion.

FIG. 12 illustrates the layout around the buffer portion. The clock input buffer 101 and the output data latch circuit 90 for the LPC bus interface are disposed very close to the output buffer 53 and the data output terminal 2(D). On the other hand, the output data latch circuit 92 for general purpose is disposed at the input/output port 2 and is relatively apart from the output buffer 53 and the data output terminal 2(D).

Figure 13:
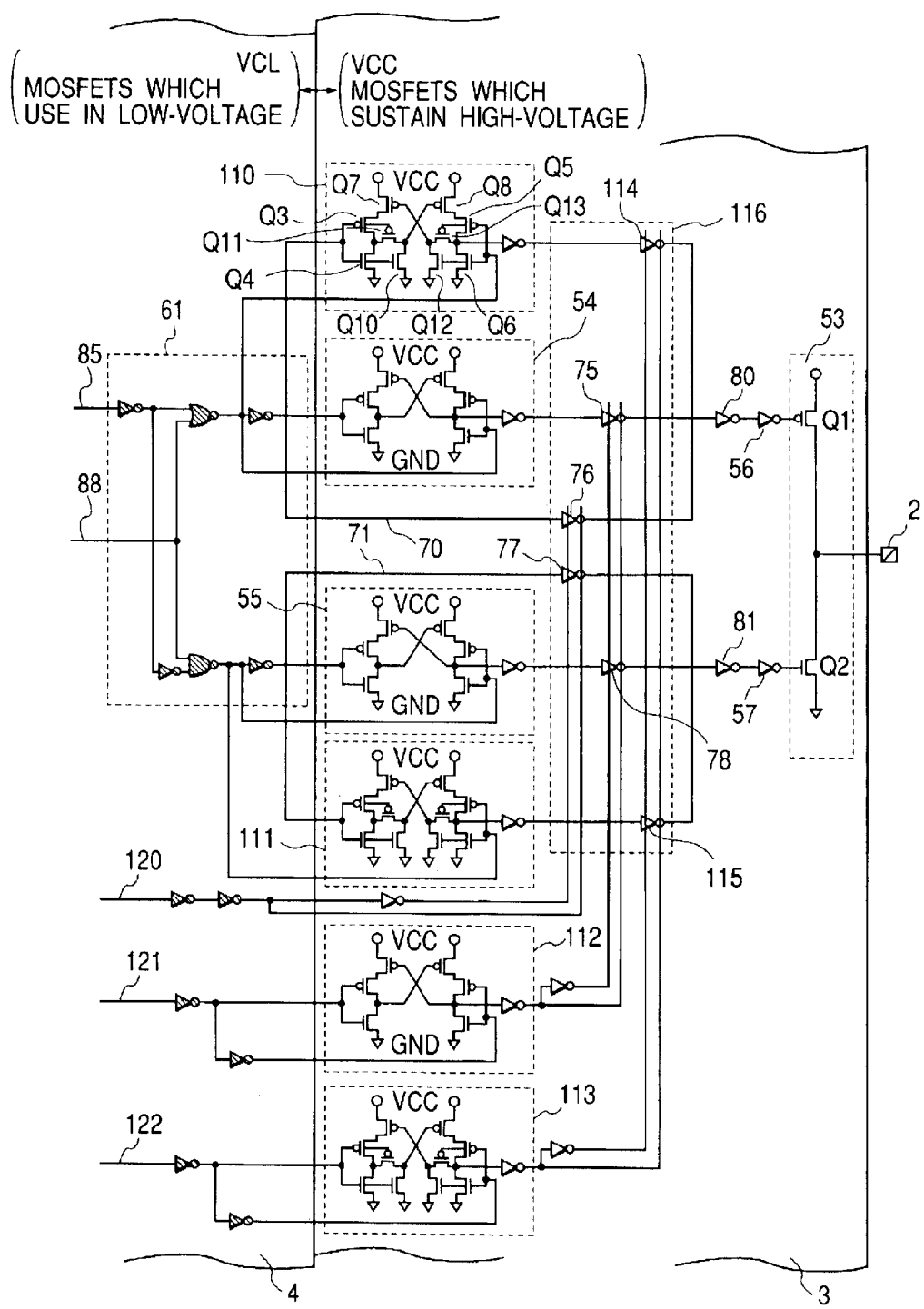
FIG. 13 is a circuit diagram showing an example of a semiconductor integrated circuit capable of selecting any of two kinds of external power supply voltages for high-voltage operation.

FIG. 13 illustrates an example of a semiconductor integrated circuit capable of selecting any of two kinds of external power supply voltages for performing a high-voltage operation. A low-voltage operation form in the normal operation is set as VCC=VCL=1.8V. A first high-voltage operation form in the normal operation is set as VCC=3.3V and VCL=1.8V. A second high-voltage operation form in the normal operation is set as VCC=5.0V and VCL=1.8V. A high-voltage operation form at the time of burn-in is set as VCC=7.0V ad VCL=2.8V. The level shifting range of the level shift circuit which is adapted to the operation forms has to be varied according to an external power supply. In the case where priority is placed on high speed of shifting in the plurality of level shifting ranges by the single circuit configuration, it is the best way to employ level shift circuits of different circuit configurations according to the level shifting ranges. Therefore, in FIG. 13, level shift circuits 110, 111, and 113 are employed for shifting of a wide shifting level range. The level shift circuits 110, 111, and 113 are obtained by adding MOS transistors Q10 and Q11 to accelerate charge pull-out from the common drain of the MOS transistors Q3 and Q4 to the level shift circuits 54 and 55 and, similarly, adding MOS transistors Q12 and Q13 to accelerate charge pull-out from the common drain of the MOS transistors Q5 and Q6. To a selecting circuit 116, clocked inverters 114 and 115 for selecting the level shift circuits 110 and 111 are added. Further, three selection signals 120, 121, and 122 for performing the selecting operation of the selecting circuit 116 are used. The selection signals 121 and 122 are subjected to level shifting in the level shift circuits 112 and 113 and the resultant signals are supplied to the clocked inverters 75 and 76 and the clocked inverters 114 and 115. In the example of FIG. 5, the possible level of the signal 87 in the high-voltage operation form is limited to the low level, so that no level shifting is required in the propagation path of the selection control signal 87. In contrast, in the example of FIG. 13, the possible level of the signals 121 and 122 in the high-voltage operation form is not limited to the low level, so that the level shift circuits 112 and 113 are necessary. In the circuit configuration of FIG. 13, a circuit element having the same function as that in FIG. 5 is designated by the same reference numeral and its detailed description will not be repeated.

FIG. 14 illustrates a correspondence relation between the valid/invalid state of the LPC communication in the semiconductor integrated circuit of FIG. 13 and the operation power supply. In a manner similar to FIG. 7, the operation status is roughly divided into burn-in and normal operation (operation status other than burn-in), and the normal operation is roughly divided into valid LPC communication and invalid LPC communication. In the low-voltage operation form (VCC=VCL=1.8V) in the normal operation, the LPC communication is valid. In the operation form, in the case of performing a host interface control using the LPC bus HIF circuit 20, by setting the control signal 120 to the high level (VCL level in this case) and setting the control signals 121 and 122 to the low level (0V in this case), in the buffer portion 3 for interface, therefore, the clocked inverters 76 and 77 in the selecting circuit 116 are turned on, the clocked inverters 75, 78, 114, and 115 are turned off, and the bypasses 70 and 71 are selected. In such a manner, the high-speed LPC bus interface can be realized.

In the first high-voltage operation form (VCC=3.3V, VCL=1.8V) in the normal operation, the LPC communication is made invalid. In the operation form, the control signal 121 is set to the high level, and the control signals 120 and 122 are set to the low level. In the buffer portion 3, the clocked inverters 76, 77, 114, and 115 of the selecting circuit 116 are turned off, the clocked inverters 75 and 78 are turned on, outputs of the level shift circuits 54 and 55 are selected, the small amplitude of the stepped-down voltage is expanded to the amplitude of the external power supply by the level shift circuits 54 and 55, and the resultant can be output as an output of the output terminal 2 from the output buffer 53. The invention can be applied to a system using an operation voltage such as 3.3V.

In the second high-voltage operation form (VCC=5.0V, VCL=1.8V) in the normal operation, the LPC communication is made invalid. In the operation form, the control signal 121 is set to the high level, and the control signals 120 and 122 are set to the low level. In the buffer portion 3, the clocked inverters 75 to 78 of the selecting circuit 116 are turned off, the clocked inverters 114 and 115 are turned on, outputs of the level shift circuits 110 and 111 are selected, and the small-amplitude of the stepped-down voltage is expanded to the amplitude of the external power supply by the level shift circuits 110 and 111. In such a manner, the resultant can be output as an output of the output terminal 2 from the output buffer 53. The invention can be applied to a system using an operation voltage of 5.0V.

In the high-voltage operation form at the time of burn-in, VCC=7.0V and VCL=2.8V, in a manner similar to the second high-voltage operation form in the normal operation, the control signals 120 and 121 are set to the low level and the control signal 122 is set to the high level to make the shifting function of the level shift circuits 110 and 111 valid. Therefore, for the input/output port 4 and internal digital portion 7 of a relatively low breakdown voltage, burn-in can be carried out with a relatively low voltage of about 2.8V. For the buffer portion 3 or the like having a high breakdown voltage, burn-in can be carried out with a relatively high external power voltage of about 7.0V. Thus, the reliability of burn-in also for the circuit 3 having a high breakdown voltage can be guaranteed. Moreover, the input/output port 2 which operates with a low voltage is connected to the buffer portion 3 which operates with a high voltage via the level shift circuits 110 and 111. Consequently, a situation such that a signal of an intermediate level is continuously supplied from the input/output port 2 directly to the inverter of the buffer portion 3 does not occur.

Figure 15:
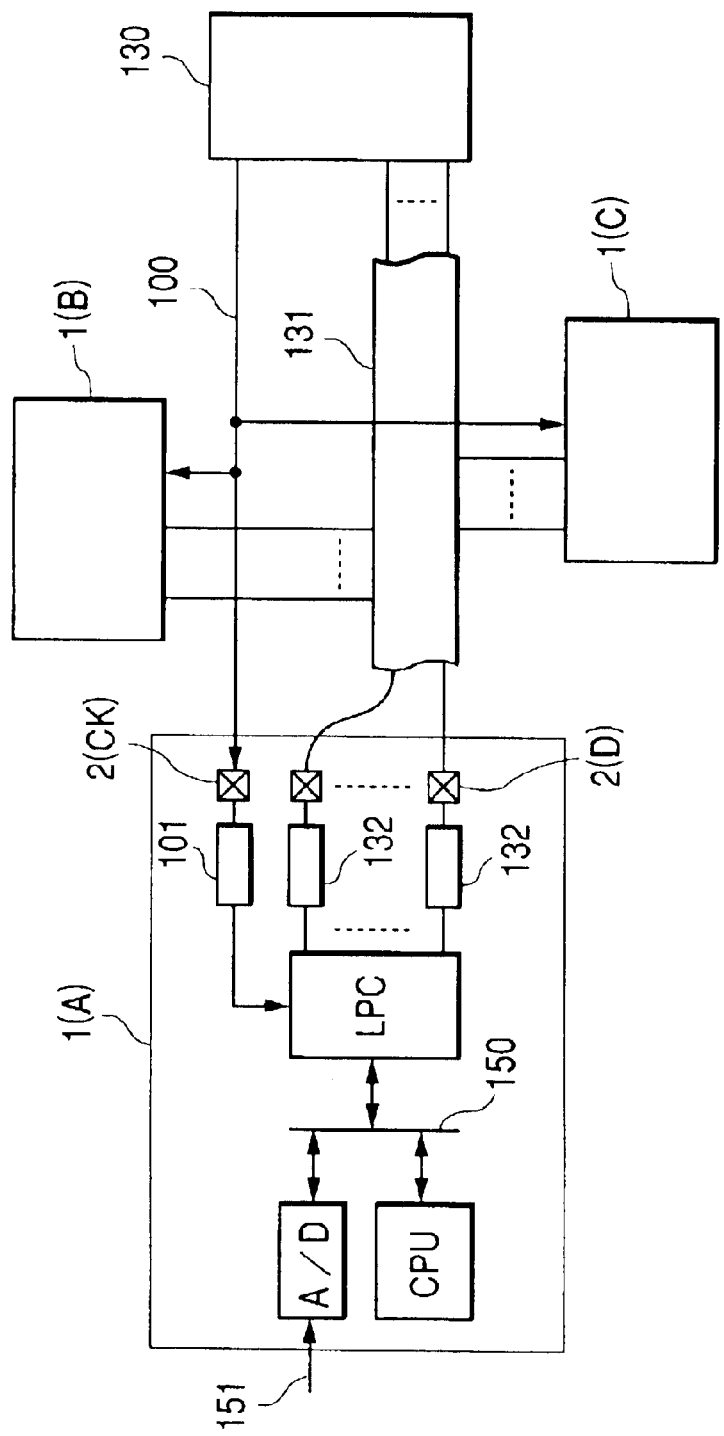
FIG. 15 is a block diagram illustrating a data processing system used as any of various interface controller LSIs in which a microcomputer is connected to an LPC bus.

FIG. 15 illustrates a data processing system using the microcomputer 1 as various interface controller LSIs connected to the LPC bus. To an LPC bus 131 connected to a host processor 130, a plurality of interface controllers 1(A), 1(B), 1(C), and the like each taking the form of the microcomputer 1 are connected. The interface controller 1(A) realizes a keyboard interface, the interface controller 1(B) realizes a mouse interface, and the interface controller 1(C) realizes a power management information exchange interface. The configuration of the LPC bus HIF circuit (LPC) of each of the interface controllers 1(A), 1(B), and 1(C) is equivalent to the configuration explained with reference to FIGS. 11 and 12. Each LPC bus HIF circuit (LPC) operates synchronously with the PCI clock signal 100 output from the host processor 130, and a high-speed output operation which is performed within predetermined time since the rising edge of the PCI clock signal 100 is achieved. Reference numeral 132 denotes a circuit block generically called for the data output buffer 53, selecting circuit 74, level shift circuits 54 and 55, bypasses 70 and 71, data input buffer, data output latch circuit, and the like. The interface controller 1(A) has an A/D converter (A/D) for converting an analog signal 151 supplied from the outside to a digital signal, a central processing unit (CPU), and an internal bus 150 to which the A/D converter (A/D), the central processing unit (CPU), and the LPC bus HIF circuit (LPC) are coupled. The central processing unit (CPU) performs, although not limited, a process of transferring a digital signal converted by the A/D converter (A/D) to the LPC bus HIF circuit (LPC) via the internal bus 150.

Although the invention has been concretely described above on the basis of the embodiment, obviously, the invention is not limited to the embodiment but can be variously modified without departing from the gist.

For example, the circuit performing the external interface synchronously with a clock is not limited to the LPC bus HIF circuit but may be anther interface circuit module. The configuration of the level shift circuit is not limited to a static latch form. In the above, the level shift circuit and the bypass for the output buffer have been described. Although the level shift circuit may be also provided for an input buffer, the level shifting in this case is lowering in the level. Even if the level shift circuit is not provided, in this sense, there is no harm in input operation and in the burn-in operation. The semiconductor integrated circuit is not limited to a circuit of the name of a microcomputer but can be widely applied to an interface controller or an LSI such as a system LSI. The operation voltage of the semiconductor integrated circuit is not also limited to the above. The kinds of the external power supply voltages which can be applied in the high-voltage operation form are not limited to the two kinds described by referring to FIGS. 13 and 14 but the invention can be also applied to a case where the number of kinds is three or more. The use of the LPC bus HIF circuit is not limited to the use described by referring to FIG. 15.

Effects obtained by representative ones of the inventions disclosed in the specification will be briefly described as follows.

In the use form of operating the first circuit and the second circuit having a breakdown voltage higher than that of the first circuit with a low voltage, a bypass in a predetermined level shift circuit is connected to the input of a predetermined external output buffer. Consequently, a high-speed external interface using the external output buffer connected to the bypass can be realized without being influenced by operation delay due to level shifting.

In the use form using a high voltage for an external interface, the first circuit is operated with a low voltage, the second circuit is operated with a high voltage, a level shift circuit is interposed without selecting a bypass in the predetermined external output buffer, the signal amplitude of a low voltage in the first circuit is shifted to the signal amplitude of a high voltage of the second circuit, and the resultant signal can be supplied to the external output buffer.

Also in the case of employing any of the use forms for the semiconductor integrated circuit, at the time of burn-in, the first circuit is operated with a low voltage for burn-in, the second circuit is operated with a high voltage for burn-in, a bypass is not selected in the predetermined external output buffer but the level shift circuit is interposed, the signal amplitude of the low voltage for burn-in in the first circuit is shifted to that of the high voltage for burn-in of the second circuit, and the resultant can be supplied to the external output buffer. Since a shoot-through current does not pass into the second circuit by an intermediate-level signal having a relatively small amplitude of the first circuit, deterioration in the characteristic or destruction of the second circuit caused by the shoot-through current does not occur. Therefore, burn-in can be carried out in the first and second circuits by using the operation powers adapted to the breakdown voltages of the circuits, so that reliability of burn-in can be guaranteed.

From the viewpoint of prevention of the output operation delay due to the level shift circuits and maintenance of a high breakdown voltage of the output buffer, higher-speed external output operation synchronized with clock signals can be realized.

From the viewpoint of suppression of the clock delay, higher-speed external output operation synchronized with external clock signals can be realized.

From the viewpoint of prevention of the output operation delay due to the level shift circuits and maintenance of a high breakdown voltage of the output buffer, reliability of burn-in in a semiconductor integrated circuit in which the speed of the external output operation synchronized with clocks is increased can be improved.

What is claimed is:

1. A semiconductor integrated circuit comprising:

a first circuit; and a second circuit having a breakdown voltage higher than a breakdown voltage of said first circuit, in which operation voltages of said first and second circuits can be made equal to each other or different from each other, wherein said second circuit comprises:

a plurality of level shift circuits capable of shifting the level of an output of said first circuit in accordance with an operation voltage of said second circuit;

a plurality of external output buffers receiving outputs of said level shift circuits;

a bypass circuit bypassing an input of a predetermined one of said level shift circuits to an input of a predetermined one of said external output buffers; and a selecting circuit selecting connection of either said predetermined level shift circuit or a bypass to an input of said predetermined external output buffer.

2. The semiconductor integrated circuit according to claim 1, wherein said level shift circuit is constructed by a plurality of level shift circuits having level shifting ranges which are different from each other.

3. The semiconductor integrated circuit according to claim 1, further comprising:

an internal power step-down circuit stepping down an input voltage from a first external terminal, wherein said second circuit uses an input voltage supplied to the first external terminal as an operation voltage, and wherein said first circuit uses, as an operation power, a stepped-down output voltage of said internal power step-down circuit or an input voltage from a second external terminal.

4. The semiconductor integrated circuit according to claim 3, wherein when the operation voltage of the first circuit and that of the second circuit are made different from each other, an external power supply voltage is connected to a first terminal and a stabilized capacitative element is coupled to a second terminal, and wherein when the operation voltage of the first circuit and that of the second circuit are made equal to each other, the same external power supply voltage is coupled to the first and second terminals.

5. The semiconductor integrated circuit according to claim 1, wherein said first circuit has a register holding selection control information of said selecting circuit.

6. The semiconductor integrated circuit according to claim 1, wherein said first circuit has an output latch circuit latching output data of said predetermined external output buffer synchronously with a clock signal and a data processing circuit for processing data to be latched by said output latch circuit.

7. The semiconductor integrated circuit according to claim 6, wherein said output latch circuit is included in a predetermined IO port.

8. The semiconductor integrated circuit according to claim 6, wherein said output latch circuit is neighboring to said predetermined external output buffer.

9. The semiconductor integrated circuit according to claim 6, wherein said clock signals are supplied from the outside in parallel to said output latch circuit and said data processing circuit.

10. The semiconductor integrated circuit according to claim 6, wherein said data processing circuit is a host interface control circuit.

11. The semiconductor integrated circuit according to claim 10, wherein said host interface control circuit and said output latch circuit operate synchronously with said external clock signal of 33 MHz.

* * * * *